United States Patent [19]

Moutou et al.

[11] 4,006,490
[45] Feb. 1, 1977

[54] CATHODE FOR GUNN DIODE AND GUNN DIODE COMPRISING SUCH A CATHODE

[75] Inventors: Paul-Cyril Moutou; Jean-Jacques Godart, both of Paris, France

[73] Assignee: Thomson-CSF, Paris, France

[22] Filed: Nov. 28, 1975

[21] Appl. No.: 636,292

[30] Foreign Application Priority Data

Nov. 29, 1974 France .......................... 74.39190

[52] U.S. Cl. ...................................... 357/3; 357/2; 357/6
[51] Int. Cl.² ........................................ H01L 47/02
[58] Field of Search ........................... 357/2, 3, 6

[56] References Cited

UNITED STATES PATENTS

| | | | |
|---|---|---|---|
| 3,600,705 | 8/1971 | Tantraporn et al. | 357/3 |
| 3,836,990 | 9/1974 | Harth | 357/6 |

OTHER PUBLICATIONS

LeComber et al., Electronic and Structural Properties of Amorphous Semiconductors, Academic Press, N.Y., 1973, pp. 104–105.
Milnes et al., Heterojunctions and Metal Semiconductor Junctions, Academic Press, N.Y., 1972, p. 299.

*Primary Examiner*—William D. Larkins
*Attorney, Agent, or Firm*—Cushman, Darby & Cushman

[57] ABSTRACT

A Gunn diode comprises deposited in succession on the active zone of gallium arsenide of type N: a first layer of the same material having the same type of conductivity but very strongly doped, and a second layer of amorphous germanium in which is developed a tunnel effect. A metallic deposit covering this second layer serves as cathode contact.

4 Claims, 2 Drawing Figures

CATHODE FOR GUNN DIODE AND GUNN DIODE COMPRISING SUCH A CATHODE

The present invention relates to the Gunn diodes comprising a new cathode. It is concerned more particuarly with the Gunn diodes which have to work in accordance with a particular method of oscillation which is called "Limited Space Charge Accumulation". In the Gunn diodes, accumulations of mobile charges, "domains", are formed inside the material; their transit time is close to the oscillation period. In order to obviate the transit effects, it is known to avoid the formation of "domains", so as to obtain oscillations at frequencies very much higher than the natural frequency defined by the transit time of the mobile charge: this is the operation by the L.S.A. method.

In this case, the nature of the contacts of the diodes plays an important part, and more particularly the cathode contact. For obtaining good performances by the L.S.A. method, it is necessary to provide on the cathode side a non-ohmic contact which permits a limitation of the current. In the present state of the art, one solution to this problem consists in providing a Schottky barrier at the level of the cathode, but this solution has numerous inconveniences firstly, it makes use of technologies which are difficult to carry into effect, and secondly such a structure is very sensitive to temperature.

The present invention is concerned with a new type of cathode structure which overcomes these inconveniences.

The invention will be best understood from the explanations which are to follow and from the accompanying drawings, in which.

A Gunn diode is essentially formed by a piece of a material having a negative differential resistance beyond a given electric field. The material most commonly in use for obtaining the Gunn effect is gallium arsenide GaAs. On either side of an epitaxial zone of GaAs, called the active zone, there are disposed two contacts for thus obtaining respecively the anode and cathode contacts. It may be a question either of a deposit at the surface of the active zone (usually a layer of GaAs of N type) of an alloy of germanium-gold-nickel, or a succession of two deposits, one of GaAs of N+ type, effected by epitaxy on the active zone, and the other of an alloy such as previously defined.

Figure 1:
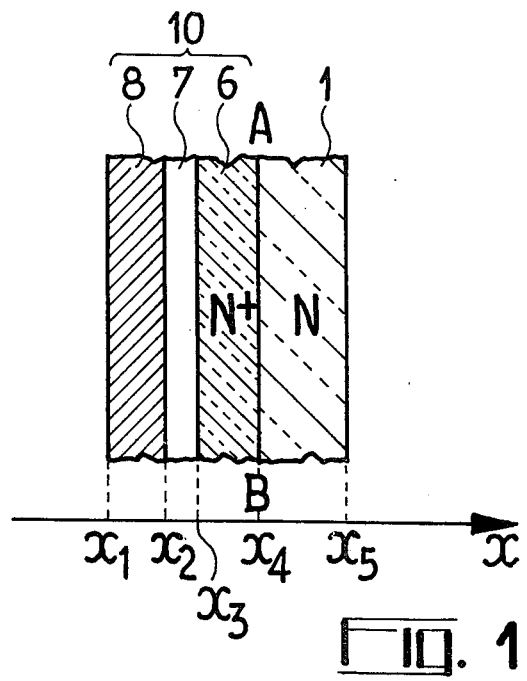
FIG. 1 is one embodiment of a device according to the invention.

The arrangement represented in FIG. 1 comprises a layer 1 of GaAs of N type, forming the active part of the diode, that is to say, the zone where the Gunn effect is produced. Formed in known manner on one of the faces of this layer 1 is an anode contact, which is not shown in the figure, because it does not contribute to the understanding of the invention.

A cathode 10 according to the invention is provided on the face AB. Such a structure comprises essentially a succession of two layers of material 6 and 7 coated with a metallic deposit 8 serving as cathode contact. The nature and the dimensions of the layers 6 and 7 are chosen so that they co-operate to permit the establishment of a sufficient electric field capable of creating a tunnel effect within the layer 7.

The first layer 6 is preferably formed of a semiconductor material of like nature, having the same type of conductivity as that which forms the active zone, but very heavily doped. The second layer 7 is formed by an appropriate material capable of permitting the establishment of a tunnel effect: it can thus be a dielectric material, an amorphous semiconductor, etc.

Figure 2:
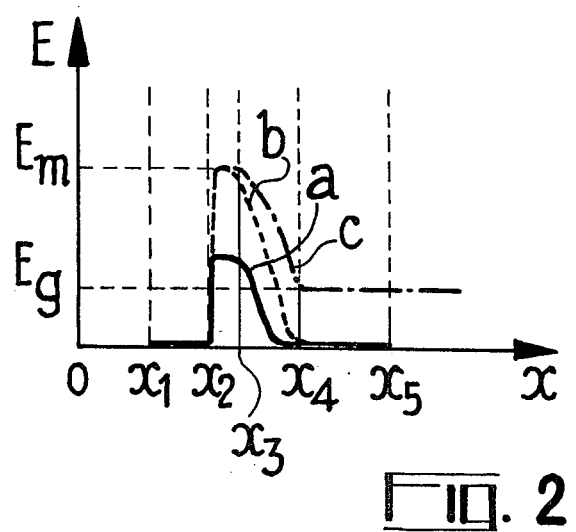
FIG. 2 is an explanatory diagram.

In one embodiment, with the active layer 1 a layer of GaAs of N type, the layer is a GaAs layer of N$^+$ type, provided by epitaxy or any other process known per se, such as ion implantation, and its thickness is in the region of 2000 A. The layer 7 is layer of amorphous germanium, the thickness of which is in the region of 100 A. It may be obtained by evaporation under vacuo. The layer 8 is metallic and it can be a deposit of a metal such as gold, nickel or an alloy produced by means of known metallisation techniques. FIG. 2 makes it possible better to understand what is the function of each of the two layers 6 and 7 and how they co-operate with one another so as to establish at the level of the cathode a non-ohmic contact which leads according to the invention to a current limitation. FIG. 2 represents the development of the electric field E along the structure such as shown diagrammatically in FIG. 1, that is to say, comprising in succession the metallic layer 8 of thickness ($x_1$ ; $x_2$) the amorphous germanium layer 7 of thickness ($x_2$ ; $x_3$); the layer 6 of GaAs of N$^+$ type of thickness ($x_3$ ; $x_4$), finally, the active zone 1 of GaAs of type N and of thickness ($x_4$; $x_5$). The curves $a$ $b$ and $c$ are drawn for increasing voltages applied between cathode and anode not shown. As shown by the curve $a$, (drawn by a solid line), the space charge in the layer 6 of type N$^+$, that is to say, between the abscissae $x_3$ and $x_4$, is displaced towards the layer 1 of N type. The field E has not reached its maximum value $E_m$. The current starts to pass by tunnel effect into the germanium. The region N$^+$ becomes completely empty and, as shown by the curve $b$, (represented as a broken line), the field in this region reaches its maximum value $E_m$. This field $E_m$ is found in the thin germanium layer, and hence there is a maximum current density I. It is therefore this maximum field $E_m$ which fixes the limitation of the current. As the field is unable to increase any more in the layer N$^+$, it will increase in the active layer of N type, as shown by the curve C, until it reaches the threshold $E_g$, from which the Gunn effect appears.

In a practical embodiment given simply by way of example, in respect of a potential barrier of about 0.4 eV and a thickness of the germanium layer 7 of the order of 100A, it is necessary to have an electric field of the order of $7.10^5$ V:cm for a current density of 3000 A/cm$^2$, that is to say, a doping rate of $2.10^{17}$ cm$^{-3}$ over a width ($x_3$; $x_4$) of the layer 7 of N$^+$ type of the order of 2000 A.

By causing a variation in the rate of doping and the thicknesses of the layers 6 and 7, it is possible to vary the value of the current density within large proportions. The development of the cathode structure for a Gunn diode in accordance with the invention has the advantage of being easy to carry into effect, in a manner which can be perfectly reproduced.

We claim:

1. A cathode for a Gunn diode comprising an active zone formed by Gallium Arsenide of a given type of conductivity, and comprising in combination two layers cooperating with one another, and situated between said active zone and a metallic deposit serving as cathode contact: the first of these layers deposited on said active zone being formed of Gallium Arsenide, having the same type of conductivity as that forming the active zone conductivity and having a strong doping concentration, and said second being formed of amorphous germanium.

2. Cathode according to claim 1, the materials forming the active zone and the first layer being respectively of N type and N+ type.

3. Cathode according to claim 2, the thickness of the first layer is of the order of 2000 A and the thickness of the second layer is in the region of 100 A.

4. Cathode according to claim 1, wherein the metallic deposit is a deposit of nickel.

* * * * *